United States Patent
Kim et al.

(10) Patent No.: US 10,181,519 B2
(45) Date of Patent: Jan. 15, 2019

(54) POWER SEMICONDUCTOR DEVICE

(71) Applicant: HYUNDAI AUTRON CO., LTD., Seongnam-si (KR)

(72) Inventors: Young Joon Kim, Suwon-si (KR); Hyuk Woo, Incheon (KR); Tae Yeop Kim, Seoul (KR); Han Sin Cho, Hwaseong-si (KR); Tae Young Park, Gunpo-si (KR); Ju Hwan Lee, Suwon-si (KR)

(73) Assignee: HYUNDAI AUTRON CO., LTD., Seongnam-si (KR)

( * ) Notice: Subject to any disclaimer, the term of this patent is extended or adjusted under 35 U.S.C. 154(b) by 0 days.

(21) Appl. No.: 15/628,362

(22) Filed: Jun. 20, 2017

(65) Prior Publication Data

US 2017/0365669 A1    Dec. 21, 2017

(30) Foreign Application Priority Data

Jun. 21, 2016   (KR) .................. 10-2016-0077605

(51) Int. Cl.

| H01L 29/00 | (2006.01) |
|---|---|
| H01L 29/40 | (2006.01) |
| H01L 29/06 | (2006.01) |
| H01L 29/739 | (2006.01) |

(52) U.S. Cl.
CPC ........ *H01L 29/402* (2013.01); *H01L 29/0619* (2013.01); *H01L 29/0623* (2013.01); *H01L 29/407* (2013.01); *H01L 29/7397* (2013.01)

(58) Field of Classification Search
CPC .......................... H01L 29/402; H01L 29/0619
USPC .................... 257/409, 488, 490, 495
See application file for complete search history.

(56) References Cited

U.S. PATENT DOCUMENTS

2008/0087952 A1* 4/2008 Pfirsch ............... H01L 29/7825
                                                                257/334
2017/0243937 A1* 8/2017 Ward .................. H01L 29/8611

FOREIGN PATENT DOCUMENTS

| JP | 5188037 B2 | 4/2013 |
|---|---|---|
| KR | 10-2016-0055821 A | 5/2016 |

\* cited by examiner

*Primary Examiner* — Matthew E Warren
(74) *Attorney, Agent, or Firm* — Morgan, Lewis & Bockius LLP

(57) ABSTRACT

The present invention provides a semiconductor device comprising a substrate including an active region and an edge region and containing a semiconductor doped with impurities having a first conductivity type; an insulating film disposed on the edge region of the substrate; a field plate pattern disposed on the insulating film; and at least one first doped region having a second conductivity type buried in the edge region of the substrate and extending in a direction having a vector component parallel to an upper surface of the substrate.

15 Claims, 3 Drawing Sheets

POWER SEMICONDUCTOR DEVICE

CROSS-REFERENCE TO RELATED APPLICATIONS

This application claims priority to and the benefit of Korean Patent Application No. 10-2016-0077605 filed in the Korean Intellectual Property Office on Jun. 21, 2016, the entire contents of which are incorporated herein by reference.

BACKGROUND

Field

The present invention relates to a power semiconductor device and a manufacturing method thereof, and more particularly, to an insulated gate bipolar transistor (IGBT) device and a manufacturing method thereof.

Related Technology

Insulated gate bipolar transistor (IGBT) is developed through a functional integration of metal-oxide-semiconductor (MOS) technology and bipolar physics. It is characterized by its low saturation voltage and fast-switching capabilities. Its application is expanded to applications that cannot be realized with thyristors, bipolar transistors, MOSFET, etc. It also is a next-generation power semiconductor device that is essentially used in a high-efficiency, high-speed power system widely used in a voltage range of 300 V or higher. Since the development of power MOSFETs in the 1970s, MOSFETs have been used as switching devices in the fields where fast-switching capabilities are required, while bipolar transistors, thyristors, GTOs, etc. have been used in the fields where a large amount of current conduction is required at medium to high voltages. The IGBT, which was developed in the early 1980s, has a better current capability than bipolar transistors in terms of output characteristics and has gate driving characteristics like MOSFETs in terms of input characteristics, and therefore it is capable of switching at a high speed of about 100 KHz. Accordingly, the IGBT is being used in a wide range of applications, from industrial to home electronics since it is used not only for devices to replace MOSFETs, bipolar transistors, and thyristors but also for creating new application systems.

A related prior art is Korean Laid-Open Publication No. 20140057630 (published on May 13, 2014, entitled "IGBT and manufacturing method thereof").

SUMMARY

An object of the present invention is to provide a power semiconductor device capable of lowering the resistance and improving the short circuit and the breakdown voltage characteristic, and a method of manufacturing the same. However, these problems are illustrative, and thus the scope of the present invention is not limited thereto.

A power semiconductor device according to an aspect of the present invention for solving the above problems is provided. The power semiconductor device includes a substrate including an active region and an edge region and containing a semiconductor doped with impurities having a first conductivity type; an insulating film disposed on the edge region of the substrate; a field plate pattern disposed on the insulating film; and at least one first doped region having a second conductivity type buried in the edge region of the substrate and extending in a direction having a vector component parallel to an upper surface of the substrate.

In the power semiconductor device, the first doped region having a second conductivity type may extend in a direction parallel to the upper surface of the substrate.

The power semiconductor device may further include at least one second doped region having a second conductivity type and having a shape extending downward from the upper surface of the substrate in the substrate, and the first doped region having a second conductivity type may have a shape protruding laterally from the second doped region.

In the power semiconductor device, the first doped region may be connected to the lower end of the second doped region and protrude laterally.

In the power semiconductor device, the first doped region may be disposed below and spaced apart from the second doped region.

In the power semiconductor device, the least one second doped region having a second conductivity type may include a plurality of second doped regions having a second conductivity type arranged spaced apart from each other, and the at least one first doped region having a second conductivity type may include a plurality of first doped regions having a second conductivity type arranged spaced apart from each other and each having a shape protruding laterally from the second doped region.

In the power semiconductor device, a spacing between one of the plurality of second doped regions and the immediately adjacent one of the second doped regions may become larger as they are further away from the active region.

In the power semiconductor device, a voltage distribution in a direction perpendicular to the upper surface of the substrate may have a voltage reversal section between a first surface penetrating the first doped region in a direction parallel to the upper surface of the substrate and a second surface penetrating the second doped region in a direction parallel to the upper surface of the substrate and disposed above the first surface such that the lowest voltage is generated on the first surface.

In the power semiconductor device, with the voltage reversal section formed, an electric field may be generated in a direction from the second surface to the first surface at an interface between the substrate containing the semiconductor doped with impurities having a first conductivity type and the insulating film.

According to embodiments of the present invention as described above, a power semiconductor device capable of preventing the deterioration of characteristics in the high-temperature reverse voltage reliability testing due to the variation in charge at the interface of the semiconductor. Of course, the scope of the present invention is not limited by these effects.

EXPLANATION OF REFERENCE NUMERALS

Figure 1:
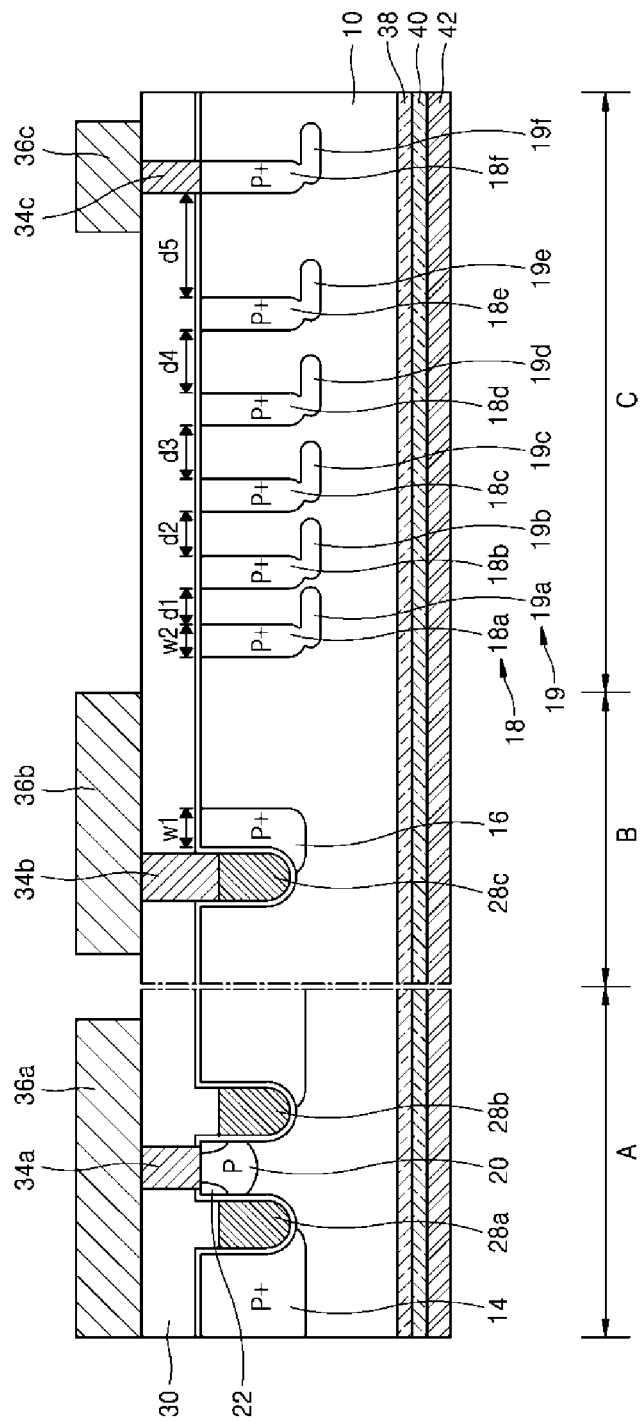
FIG. 1 is a cross-sectional view illustrating a structure of a power semiconductor device according to an embodiment of the present invention.

10: substrate
18: second doped region
19: first doped region
20: body region
22: source region
28a, 28b, 28c: gate electrode pattern
30: interlayer insulating film
36b: field plate pattern

DETAILED DESCRIPTION

Hereinafter, embodiments of the present invention will be described in detail with reference to the accompanying drawings. However, it should be understood that the present invention is not limited to the embodiments described below, but may be embodied in various other forms. The following embodiments are intended to give a more complete description of the present disclosure, and are provided in order to fully convey the scope of the disclosure to those skilled in the art. Also, at least some of the components may be exaggerated or reduced in size for convenience of explanation. Like reference numerals refer to like elements throughout the drawings.

In this specification, a first conductivity type and a second conductivity type may have opposite conductivity types, and may be one of n-type and p-type, respectively. For example, the first conductivity type may be of n-type and the second conductivity type may be of p-type, and these conductivity types are illustratively represented in the accompanying drawings. However, the technical idea of the present invention is not limited thereto. For example, the first conductivity type may be of p-type and the second conductivity type may be of n-type.

FIG. 1 is a cross-sectional view illustrating a structure of a power semiconductor device according to an embodiment of the present invention.

Referring to FIG. 1, a power semiconductor device according to an embodiment of the present invention includes a substrate 10 including an active region A and edge regions B and C and containing a semiconductor doped with impurities having a first conductivity type.

The substrate 10 may be understood to include a semiconductor wafer and an epitaxial layer that is epitaxially grown on the wafer. The semiconductor wafer may include, for example, a silicon wafer lightly doped with impurities having a first conductivity type. Illustratively, the doping concentration of the n-type impurity in the silicon wafer may be, for example, about $10^{13}/cm^3$ to about $10^{16}/cm^3$. Considering the doping concentration of the n-type impurity, the substrate 100 may be referred to as an N-substrate. However, the material, the doping concentration, etc. of the substrate 100 are not limited thereto, and may vary.

The active region A includes a region where a plurality of active cells exists and therefore current conduction occurs along the vertical direction. In the active region A, there are provided gate electrodes 28a and 28b implemented by lining a gate insulating film on the inner wall of trenches formed in the substrate 10 and filling the trenches with a gate electrode material, a body region 20 having a second conductivity type and a source region 22 having a first conductivity type that are formed between the gate electrodes 28a and 28b, and a floating region 14 having a second conductivity type formed on one side of the gate electrodes 28a and 28b. Furthermore, there may be provided an interlayer insulating film 30 formed on the upper surface of the substrate 10 and a first contact plug 34a that penetrates the interlayer insulating film 30 and contacts a surface of the substrate.

A first metal film pattern 36a having a flat upper surface is provided on the interlayer insulating film 30. The first metal film pattern 36a may contact the first contact plug 34a. The first metal film pattern 36a may have a shape covering most of the upper portion of the active region A. The first metal film pattern 36a may be provided as a film for wire bonding. In addition, the first metal film pattern 36a may serve as an emitter electrode.

A field stop region 38 may be provided on the lower surface of the substrate 10 opposite to the upper surface. The field stop region 38 may be a region doped with impurities having a first conductivity type. For example, the doping concentration of the n-type impurity in the field stop region 38 may be about $10^{14}/cm^3$ to about $10^{18}/cm^3$. Considering the doping concentration of the n-type impurity in the field stop region 38, the field stop region 38 may be referred to as an NO layer. A collector region 40 may be provided below the field stop region 38. The collector region 40 may be a region doped with impurities having a second conductivity type. A second metal film 42 may be provided under the collector region 40. The second metal film 42 may be provided as a collector electrode.

The edge regions B and C are disposed adjacent to the active region A. The mutual positional relationship between the edge regions B and C and the active region A may vary. For example, the edge regions B and C may be formed to surround at least part of the active region A.

Among the edge regions B and C, a region in which a field plate pattern 36b is formed on the insulating film 30 as a second metal film pattern that is different from the first metal film pattern 36a may be referred to as a peripheral region B. The field plate pattern 36b can suppress the electric field concentration around edges and the field plate pattern 36b can be so wide as to increase the suppression effect.

With the field plate pattern 36b provided, the electric field concentration can be suppressed even if the width w1 of a junction termination extension region 16 is reduced. Furthermore, the field plate pattern 36b may be provided as a gate bus line electrically connected to the entire gate electrodes 28a and 28b formed in the active region A. The field plate pattern 36b may be formed along the periphery of the active region A. For example, the field plate pattern 36b may be formed in the shape of a ring of a closed loop, but the shape is not limited thereto.

The peripheral region B may be provided with a connection portion 28c disposed in the trench formed in the substrate 10. The connection portion 28c may connect one first gate electrode 28a and one second gate electrode 28b adjacent to the one first gate electrode 28a. A plurality of gate electrode patterns including the first gate electrode 28a, the second gate electrode 28b, and the connection portion 28c may be provided, and the gate electrode patterns may be repeatedly arranged while being spaced apart from each other at regular distances. The gate electrode pattern may have the shape of a ring when seen in the plan view. Since the connection portion 28c has a rounded shape, the electric field concentration in the connection portion 28c can be suppressed.

The junction termination extension (JTE) region 16 may be provided on the substrate 10 in contact with the connection portion 28c. The junction termination extension region 16 may be doped with impurities having the same conductivity type as that of the floating well region 14. The junction termination extension region 16 may be doped with high concentration impurities having a second conductivity type. The junction termination extension region 16 may have the shape of a ring surrounding the exterior of the active region A when seen in the plan view.

Among the edge regions B and C, a region in which at least one first doped region 19 having a second conductivity type that is buried in the substrate 10 and extends in a direction having a vector component parallel to the upper surface of the substrate 10 is formed may be referred to as an edge termination region C. The edge termination region C is a region for supporting a high breakdown voltage.

The first doped region 19 having a second conductivity type extends in a predetermined direction, and the predetermined direction has a vector component parallel to the upper surface of the substrate 10. For example, the first doped region 19 may extend in a direction parallel to the upper surface of the substrate 10. Of course, in other embodiments, the first doped region 19 may extend in a direction forming an arbitrary first angle (but not 90 degrees) with the upper surface of the substrate 10.

In the edge termination region C, the power semiconductor device according to an embodiment of the present invention may include at least one second doped region 18 having a second conductivity type in the substrate 10, which has a shape extending downward from the upper surface of the substrate 10. The second doped region 18 may have the shape of a ring surrounding the active region A when seen in the plan view. The second doped region 18 may be doped with high concentration impurities having a second conductivity type. Furthermore, the second doped region 18, the floating well region 14, and the junction termination extension region 16 may have the same impurity concentration and junction depth.

The above-described first doped region 19 having a second conductivity type may have a shape protruding laterally from the second doped region 18. In the power semiconductor device shown in FIG. 1, the first doped region 19 may be connected to the lower end of the second doped region 18 and protrude laterally.

At least one second doped region 18 having a second conductivity type may include a plurality of second doped regions 18 having a second conductivity type arranged spaced apart from each other, and at least one first doped region 18 having a second conductivity type may include a plurality of first doped regions 19 having a second conductivity type arranged spaced apart from each other, each of which having a shape protruding laterally from the second doped region 18.

Here, the spacing between one of the plurality of second doped regions 18 and the immediately adjacent one of the second doped regions 18 may increase as they are disposed further away from the active region A in order to reduce the electric field concentration around edges of the device. Each of the spacings d1, d2, d3, d4 and d5 between the second doped regions 18a, 18b, 18c, 18d, 18e and 18f may sequentially increase with reference to the spacing d1 between the second doped regions 18a and 18b that are closest to the active region A.

A third metal film pattern 36c in contact with each of the contact plugs 34c may be provided on the interlayer insulating film 30 in the edge termination region C. The third metal film pattern 36c may have a shape connected to at least one second doped region 18. In the plan view, the third metal film pattern 36c may be in the shape of a ring. The third metal film pattern 36c may be a dummy pattern and may not operate practically as an operation circuit. However, with the third metal film pattern 36c provided, the electric field concentration can be further reduced.

Figure 2:
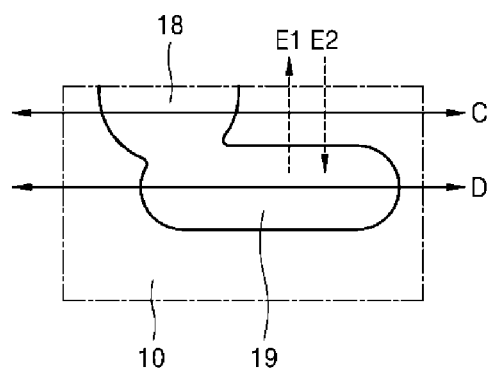
FIG. 2 is an enlarged view of a configuration of the first doped region and the second doped region shown in FIG. 1.
Figure 3:
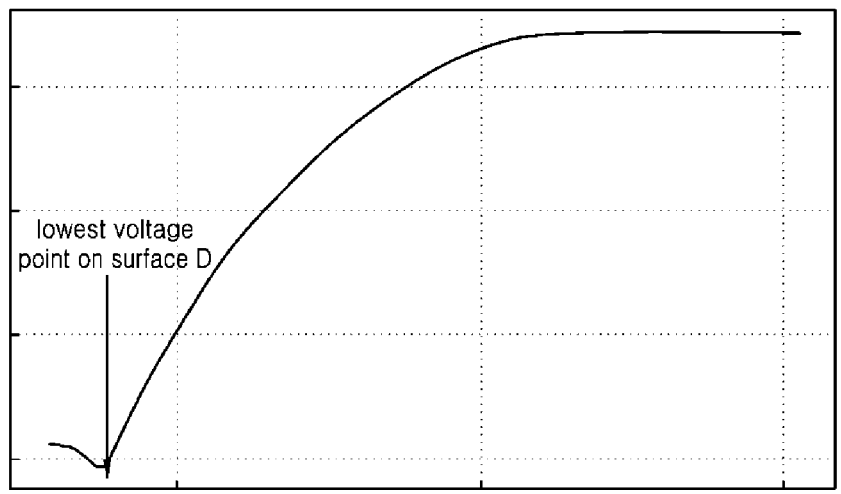
FIG. 3 is a graph illustrating a voltage distribution in a direction perpendicular to an upper surface of a substrate along a direction of penetrating the first doped region and the second doped region in a power semiconductor device according to an embodiment of the present invention.

FIG. 2 is an enlarged view of a configuration of the first doped region and the second doped region shown in FIG. 1, and FIG. 3 is a graph illustrating a voltage distribution in a direction perpendicular to an upper surface of a substrate along a direction of penetrating the first doped region and the second doped region in a power semiconductor device according to an embodiment of the present invention.

Referring to FIGS. 1 to 3, the voltage distribution along a direction perpendicular to the upper surface in the edge termination region C of the substrate 10 may have a voltage reversal section between a first surface D penetrating the first doped region 19 in a direction parallel to the upper surface of the substrate 10 and a second surface C penetrating the second doped region 18 in a direction parallel to the upper surface of the substrate 10 and disposed above the first surface D such that the lowest voltage may be generated on the first surface D. With the voltage reversal section formed, an electric field may be generated in a direction from the second surface C to the first surface D at the interface between the substrate 10 containing the semiconductor doped with impurities having a first conductivity type and the insulating film 30.

As a comparative example of the present invention, a power semiconductor device that does not include the above-described first doped region 19 can be assumed. In the comparative example of the present invention, the termination junction uses a field plate pattern to increase the horizontal electric field efficiency, but a voltage difference occurs in a direction from the substrate (i.e. silicon) to the insulating film (i.e. oxide) under the field plate pattern, a vertical electric field from the silicon-oxide interface toward the oxide is generated, and the holes move along this electric field in a direction toward the oxide in the course of reliability testing to break the hydrogen-treated dangling bonds on the surface, resulting in variations in charge in silicon at the interface and therefore leading to the problem of BV (breakdown voltage) variations.

On the other hand, in the power semiconductor device according to the embodiment of the present invention, a voltage reversal section is formed between the first surface D and the second surface C by introducing the above-described first doped region 19, and an electric field in a direction from the second surface C to the first surface D can be generated at the silicon-oxide interface. Therefore, it is possible to suppress BV deterioration caused by fluctuations in dangling bond charge in silicon during the high-temperature reverse voltage reliability testing by suppressing the variations in interfacial charge caused by the collision of the holes at the interface.

Figure 4:
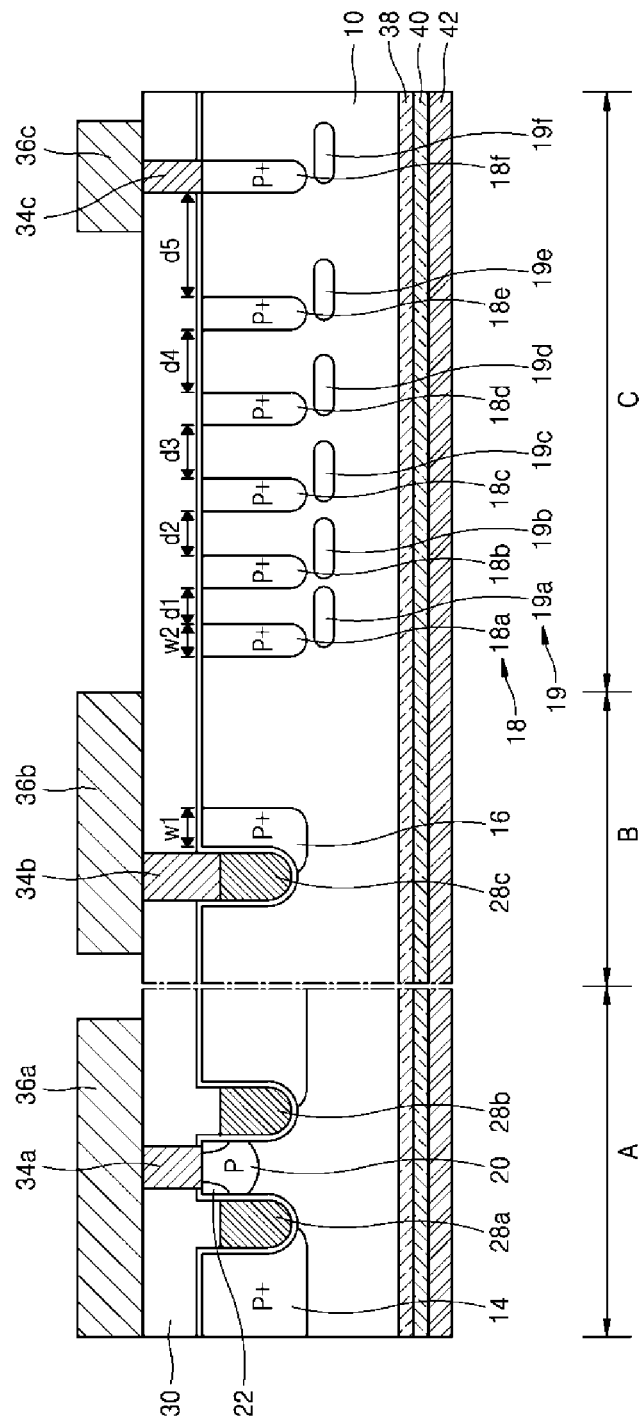
FIG. 4 is a cross-sectional view illustrating a structure of a power semiconductor device according to another embodiment of the present invention.

FIG. 4 is a cross-sectional view illustrating a structure of a power semiconductor device according to another embodiment of the present invention.

Referring to FIG. 4, a first doped region 19 may be disposed below and spaced apart from a second doped region 18. Here, also, a voltage reversal section is generated between a first surface D and a second surface C, and an electric field along a direction from the second surface C to the first surface D can be generated at the silicon-oxide interface. Therefore, it is possible to suppress BV deterioration caused by fluctuations in dangling bond charge in silicon during the high-temperature reverse voltage reliability testing by suppressing the variations in interfacial charge caused by the collision of the holes at the interface.

The descriptions with reference to FIGS. 1 to 3 may be referred to for descriptions of the remaining components.

According to the above-described embodiments of the present invention, a vertical (i.e. from top to bottom) reverse voltage is generated by using the potential of the junction at the oxide-silicon interface of the termination junction so that the deterioration of characteristics in the high-temperature reverse voltage reliability testing due to the variations in charge in silicon at the interface can be prevented.

While the present invention has been described with reference to exemplary embodiments, it is to be understood that the invention is not limited to the disclosed exemplary embodiments, but, on the contrary, is intended to cover various modifications and equivalent arrangements included within the spirit and scope of the appended claims. Therefore, the true scope of the present invention should be determined by the technical idea of the appended claims.

The invention claimed is:

1. A power semiconductor device comprising:
    a substrate including an active region and an edge region and containing a semiconductor doped with impurities having a first conductivity type;
    an insulating film disposed on the edge region of the substrate;
    a field plate pattern disposed on the insulating film and connected to the substrate by penetrating through the insulating film; and
    at least one first doped region having a second conductivity type buried in the edge region of the substrate and extending in a direction having a vector component parallel to an upper surface of the substrate,
    wherein the substrate includes a trench in the active region of the substrate and a gate electrode is formed in the trench.

2. The device of claim 1, wherein the first doped region having a second conductivity type extends in a direction parallel to the upper surface of the substrate.

3. The device of claim 1, further comprising:
    at least one second doped region having a second conductivity type and having a shape extending downward from the upper surface of the substrate in the substrate,
    wherein the first doped region having a second conductivity type has a shape protruding laterally from the second doped region.

4. The device of claim 3, wherein the first doped region is connected to the lower end of the second doped region and protrudes laterally.

5. The device of claim 3, wherein the first doped region is disposed below and spaced apart from the second doped region.

6. The device of claim 3,
    wherein the least one second doped region having a second conductivity type includes a plurality of second doped regions having a second conductivity type arranged spaced apart from each other, and
    wherein the at least one first doped region having a second conductivity type includes a plurality of first doped regions having a second conductivity type arranged spaced apart from each other and each having a shape protruding laterally from the second doped region.

7. The device of claim 6, wherein a spacing between one of the plurality of second doped regions and the immediately adjacent one of the second doped regions becomes larger as the second doped regions are disposed further away from the active region.

8. The device of claim 1,
    wherein a voltage distribution in a direction perpendicular to the upper surface of the substrate has a voltage reversal section between a first surface penetrating the first doped region in a direction parallel to the upper surface of the substrate and a second surface penetrating the second doped region in a direction parallel to the upper surface of the substrate and disposed above the first surface such that the lowest voltage is generated on the first surface.

9. The method of claim 8, wherein, with the voltage reversal section formed, an electric field is generated in a direction from the second surface to the first surface at an interface between the substrate containing the semiconductor doped with impurities having a first conductivity type and the insulating film.

10. The device of claim 4,
    wherein the least one second doped region having a second conductivity type includes a plurality of second doped regions having a second conductivity type arranged spaced apart from each other, and
    wherein the at least one first doped region having a second conductivity type includes a plurality of first doped regions having a second conductivity type arranged spaced apart from each other and each having a shape protruding laterally from the second doped region.

11. The device of claim 5,
    wherein the least one second doped region having a second conductivity type includes a plurality of second doped regions having a second conductivity type arranged spaced apart from each other, and
    wherein the at least one first doped region having a second conductivity type includes a plurality of first doped regions having a second conductivity type arranged spaced apart from each other and each having a shape protruding laterally from the second doped region.

12. The device of claim 2,
    wherein a voltage distribution in a direction perpendicular to the upper surface of the substrate has a voltage reversal section between a first surface penetrating the first doped region in a direction parallel to the upper surface of the substrate and a second surface penetrating the second doped region in a direction parallel to the upper surface of the substrate and disposed above the first surface such that the lowest voltage is generated on the first surface.

13. The device of claim 3,
    wherein a voltage distribution in a direction perpendicular to the upper surface of the substrate has a voltage reversal section between a first surface penetrating the first doped region in a direction parallel to the upper surface of the substrate and a second surface penetrating the second doped region in a direction parallel to the upper surface of the substrate and disposed above the first surface such that the lowest voltage is generated on the first surface.

14. The device of claim 4,
    wherein a voltage distribution in a direction perpendicular to the upper surface of the substrate has a voltage reversal section between a first surface penetrating the first doped region in a direction parallel to the upper surface of the substrate and a second surface penetrating the second doped region in a direction parallel to the upper surface of the substrate and disposed above the first surface such that the lowest voltage is generated on the first surface.

15. The device of claim 5,
wherein a voltage distribution in a direction perpendicular to the upper surface of the substrate has a voltage reversal section between a first surface penetrating the first doped region in a direction parallel to the upper surface of the substrate and a second surface penetrating the second doped region in a direction parallel to the upper surface of the substrate and disposed above the first surface such that the lowest voltage is generated on the first surface.

* * * * *